United States Patent
Schweikert et al.

(10) Patent No.: US 11,410,909 B2
(45) Date of Patent: Aug. 9, 2022

(54) FLUID CHANNEL, POWER SEMICONDUCTOR MODULE AND METHOD FOR FABRICATING A POWER SEMICONDUCTOR MODULE

(71) Applicant: Infineon Technologies AG, Neubiberg (DE)

(72) Inventors: Christian Schweikert, Munich (DE); Alexander Kospach, Graz (AT); Sebastian Paul Hans Moeller, Maribor (SI); Benedikt Rabl, Graz (AT)

(73) Assignee: Infineon Technologies AG, Neubiberg (DE)

( * ) Notice: Subject to any disclaimer, the term of this patent is extended or adjusted under 35 U.S.C. 154(b) by 29 days.

(21) Appl. No.: 17/102,962

(22) Filed: Nov. 24, 2020

(65) Prior Publication Data
US 2021/0175151 A1  Jun. 10, 2021

(30) Foreign Application Priority Data
Dec. 5, 2019 (DE) .......................... 102019133238.9

(51) Int. Cl.
*H01L 23/473* (2006.01)
*H01L 21/48* (2006.01)
*H01L 23/367* (2006.01)

(52) U.S. Cl.
CPC ........ *H01L 23/473* (2013.01); *H01L 21/4882* (2013.01); *H01L 23/367* (2013.01); *H01L 23/3672* (2013.01)

(58) Field of Classification Search
CPC . H01L 23/473; H01L 23/427; H01L 23/3672; H01L 23/3675; H01L 23/3677; H01L 23/367; H01L 23/5385; H01L 23/46; H01L 23/467; H01L 25/072
See application file for complete search history.

(56) References Cited

U.S. PATENT DOCUMENTS

| | | | | |
|---|---|---|---|---|
| 5,375,655 | A * | 12/1994 | Lee | F28F 3/02 165/185 |
| 6,184,600 | B1 * | 2/2001 | Asao | H02K 5/207 165/47 |
| 7,288,840 | B2 * | 10/2007 | Furman | H01L 23/473 257/E23.098 |
| 2008/0073061 | A1 * | 3/2008 | Dias | H01L 23/427 165/146 |
| 2010/0230805 | A1 * | 9/2010 | Refai-Ahmed | H01L 23/36 438/107 |

(Continued)

FOREIGN PATENT DOCUMENTS

EP      3276657 A1    1/2018

*Primary Examiner* — Adam B Dravininkas
(74) *Attorney, Agent, or Firm* — Murphy, Bilak & Homiller, PLLC

(57) ABSTRACT

A fluid channel for a power semiconductor module includes a die carrier configured to carry a plurality of semiconductor dies on a first side, a plurality of cooling elements arranged on a second side of the die carrier opposite the first side, and a channel wall arranged opposite the second side of the die carrier and forming a cavity. The cooling elements are arranged in the cavity. The cooling elements are attached to the die carrier at attachment points. A majority of the attachment points are positioned vertically in alignment with positions of the semiconductor dies.

20 Claims, 4 Drawing Sheets

(56) References Cited

U.S. PATENT DOCUMENTS

| | | | | |
|---|---|---|---|---|
| 2011/0094722 A1* | 4/2011 | Mori | H01L 23/473 | 165/181 |
| 2011/0299244 A1* | 12/2011 | Dede | F28F 3/046 | 361/689 |
| 2013/0112369 A1* | 5/2013 | Matsushima | H01L 23/4006 | 165/67 |
| 2014/0158324 A1* | 6/2014 | Toch | H01L 23/473 | 165/67 |
| 2015/0122465 A1* | 5/2015 | Mori | F28D 15/00 | 165/104.33 |
| 2015/0198372 A1* | 7/2015 | Desi | H01M 10/613 | 165/151 |
| 2016/0343640 A1* | 11/2016 | Gohara | H05K 7/20927 | |
| 2018/0145009 A1* | 5/2018 | Fukuoka | H01L 23/3677 | |

\* cited by examiner

FLUID CHANNEL, POWER SEMICONDUCTOR MODULE AND METHOD FOR FABRICATING A POWER SEMICONDUCTOR MODULE

TECHNICAL FIELD

This disclosure relates in general to a fluid channel for a power semiconductor module, to a power semiconductor module, and to a method for fabricating a fluid channel.

BACKGROUND

Power semiconductor modules, in particular power semiconductor dies comprised in such modules, may generate considerable amounts of heat during operation. Dedicated cooling schemes may be necessary to dissipate this heat. A particularly efficient cooling scheme may be direct liquid cooling, wherein one side of a die carrier (carrying the power semiconductor dies on an opposite side) is in direct contact with a cooling fluid flowing through a fluid channel. Cooling elements like cooling fins may be used for efficiently transferring heat from the die carrier to the cooling fluid. However, such cooling elements may cause turbulences in the fluid flow which may in turn cause an undesirably large pressure drop in the cooling fluid. Furthermore, the power semiconductor module may not be cooled with the same efficiency across the whole surface of the die carrier. This may for example cause the formation of local thermal hotspots in the power semiconductor module. Improved fluid channels for power semiconductor modules, improved power semiconductor modules and improved method for fabricating power semiconductor modules may help with solving these and other problems.

The problem on which the invention is based is solved by the features of the independent claims. Further advantageous examples are described in the dependent claims.

SUMMARY

Various aspects pertain to a fluid channel for a power semiconductor module, the fluid channel comprising: a die carrier configured for carrying a plurality of semiconductor dies on a first side, a plurality of cooling elements arranged on a second side of the die carrier, opposite the first side, and a channel wall arranged opposite the second side of the die carrier and forming a cavity, wherein the cooling elements are arranged in the cavity, wherein the cooling elements are attached to the die carrier at attachment points and wherein a majority of attachment points are positioned vertically in alignment with the positions of the semiconductor dies.

Various aspects pertain to a fluid channel for a power semiconductor module, the fluid channel comprising: a die carrier configured for carrying a plurality of semiconductor dies on a first side, a plurality of cooling elements arranged on a second side of the die carrier, opposite the first side, and a channel wall arranged opposite the second side of the die carrier and forming a cavity, wherein the cooling elements are arranged in the cavity, wherein the cooling elements are arranged more densely in a center region of the cavity than in a fringe region of the cavity, and wherein a height profile of the cavity is configured such that a flow velocity along the fluid channel is greater in the fringe region than in the center region.

Various aspects pertain to a power semiconductor module, comprising: a die carrier, a plurality of semiconductor dies arranged on a first side of the die carrier, and a plurality of cooling elements arranged on a second side of the die carrier, opposite the first side, wherein the cooling elements are attached to the die carrier at attachment points and wherein a majority of attachment points is positioned vertically in alignment with the positions of the semiconductor dies.

Various aspects pertain to a power semiconductor module, comprising: a die carrier, a plurality of semiconductor dies arranged on a first side of the die carrier, and a plurality of cooling elements arranged on a second side of the die carrier, opposite the first side, wherein the cooling elements are arranged in rows that are in alignment with the positions of the semiconductor dies, and wherein there is a gap between consecutive positions of the semiconductor dies and also a corresponding gap between respective consecutive rows of the cooling elements.

Various aspects pertain to a method for fabricating a fluid channel for a power semiconductor module, the method comprising: providing a die carrier configured for carrying a plurality of semiconductor dies on a first side, arranging a plurality of cooling elements on a second side of the die carrier, opposite the first side, and arranging a channel wall opposite the second side of the die carrier and thereby forming a cavity, wherein the cooling elements are arranged in the cavity, wherein the cooling elements are attached to the die carrier at attachment points and wherein a majority of attachment points are positioned vertically in alignment with the positions of the semiconductor dies.

BRIEF DESCRIPTION OF THE DRAWINGS

The accompanying drawings illustrate examples and together with the description serve to explain principles of the disclosure. Other examples and many of the intended advantages of the disclosure will be readily appreciated as they become better understood by reference to the following detailed description. The elements of the drawings are not necessarily to scale relative to each other. Identical reference numerals designate corresponding similar parts.

DETAILED DESCRIPTION

In the following detailed description, directional terminology, such as "top", "bottom", "left", "right", "upper", "lower" etc., is used with reference to the orientation of the Figure(s) being described. Because components of the disclosure can be positioned in a number of different orientations, the directional terminology is simply used for purposes of illustration.

To the extent that the terms "include", "have", "with" or other variants thereof are used in either the detailed description or the claims, such terms are intended to be inclusive in a manner similar to the term "comprise". The terms "coupled" and "connected", along with derivatives thereof may be used. It should be understood that these terms may be used to indicate that two elements cooperate or interact with each other regardless whether they are in direct physical or electrical contact, or they are not in direct contact with each other; intervening elements or layers may be provided between the "bonded", "attached", or "connected" elements. However, it is also possible that the "bonded", "attached", or "connected" elements are in direct contact with each other. Also, the term "exemplary" is merely meant as an example, rather than the best or optimal.

The examples of a power semiconductor module described in the following may use various types of semiconductor dies or circuits incorporated in the semiconductor dies, among them AC/DC or DC/DC converter circuits, power MOSFET transistors, power Schottky diodes, JFETs (Junction Gate Field Effect Transistors), power bipolar transistors, logic integrated circuits, power integrated circuits, etc. The examples may also use semiconductor dies comprising MOSFET transistor structures or vertical transistor structures like, for example, IGBT (Insulated Gate Bipolar Transistor) structures or, in general, transistor structures in which at least one electrical contact pad is arranged on a first main face of the semiconductor die and at least one other electrical contact pad is arranged on a second main face of the semiconductor die opposite to the first main face.

Figure 1A:
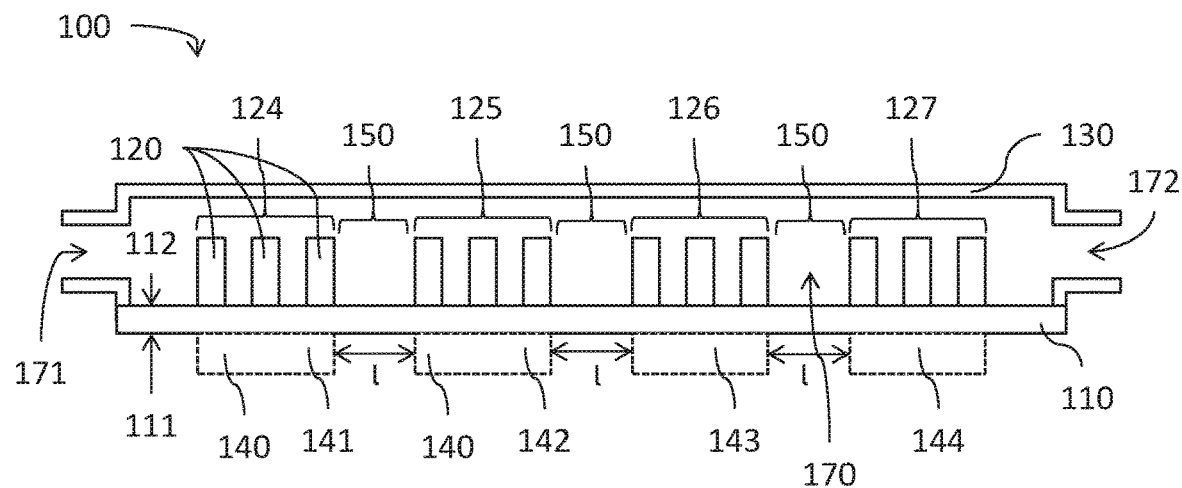
FIGS. 1A-1C show a fluid channel for a power semiconductor module, wherein the fluid channel comprises a plurality of cooling elements.
Figure 1B:
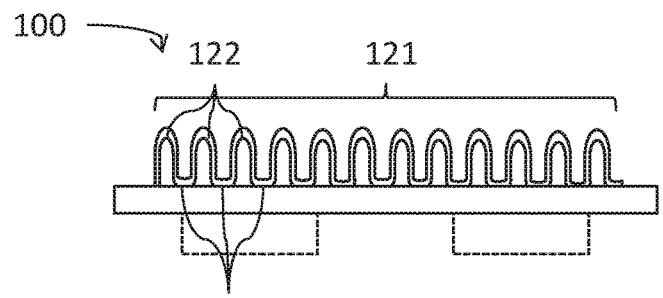
Figure 1C:
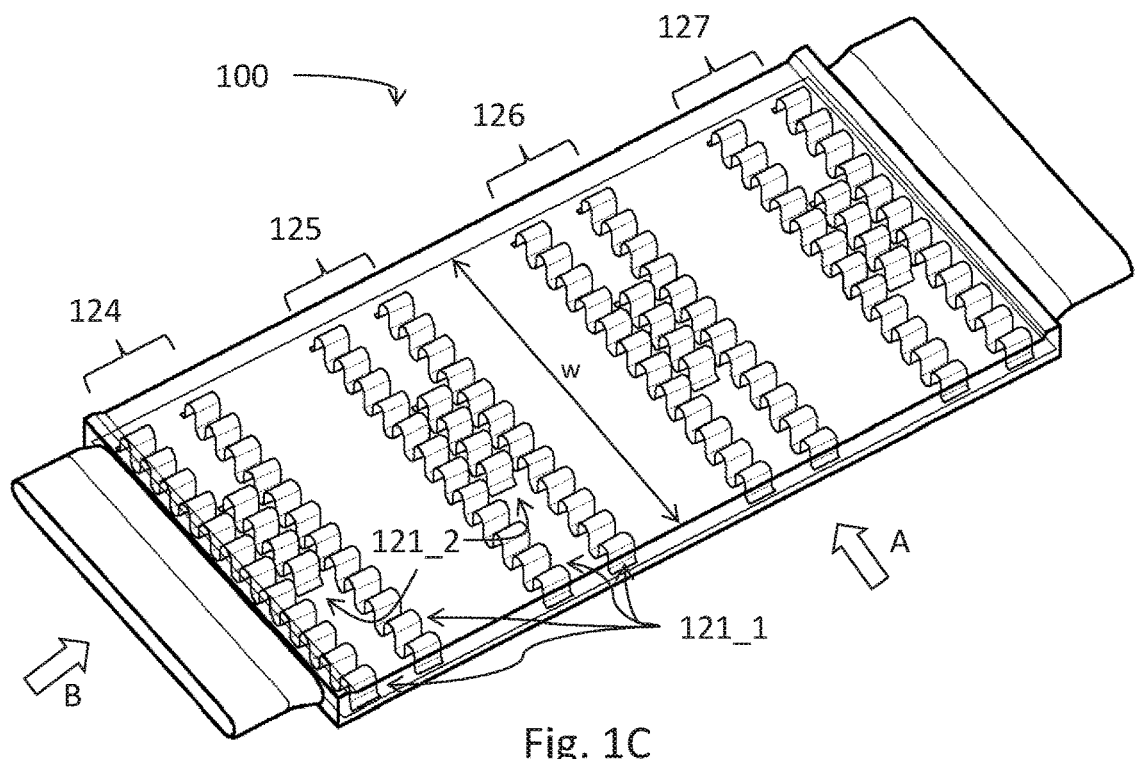

FIGS. 1A, 1B and 1C show a fluid channel 100 for a power semiconductor module. FIG. 1C shows a perspective view of the fluid channel 100, FIG. 1A shows a side view along the arrow A in FIG. 1C and FIG. 1B shows a side view along the arrow B. The fluid channel 100 comprises a die carrier 110, a plurality of cooling elements 120 and a channel wall 130.

The die carrier 110 is configured for carrying a plurality of semiconductor dies on a first side 111. Possible positions of semiconductor dies 140 are indicated by dashed lines in FIGS. 1A and 1B. The semiconductor dies 140 may for example be power semiconductor dies that are configured to operate with high electrical currents and/or high voltages. The semiconductor dies 140 may form a specific electrical circuit, for example one or more half-bridge circuits.

The die carrier 110 may be a type of die carrier that comprises at least one electrically conductive layer arranged over an electrically insulating layer. The semiconductor dies 140 may be arranged on and electrically coupled to said conductive layer. Said insulating layer may be configured to insulate the first side 111 of the die carrier 110 from an opposite second side 112. For example, the die carrier 110 may be of the type direct copper bond (DCB), direct aluminum bond (DAB), active metal brazing (AMP), etc. The conductive layer on the first side 111 may comprise conductive traces that electrically couple specific ones of the semiconductor dies 140 to one another and/or to external contacts of the power semiconductor module.

The plurality of cooling elements 120 may be arranged on the second side 112 of the die carrier 110. The cooling elements 120 may be configured to dissipate heat that is produced by the semiconductor dies 140 during operation. In particular, the cooling elements 120 may be configured to be submerged in a cooling fluid and to dissipate the heat into the cooling fluid.

According to an example, the cooling elements 120 are cooling ribbons (which may also be termed cooling loops herein). This example is shown in FIGS. 1B and 1C. According to another example, the cooling elements may comprise cooling fins or any other suitable cooling structure.

Each cooling element, in particular each cooling ribbon, may be arranged in a row 121, wherein each row 121 comprises a plurality of consecutive arcs 122. The rows 121 may be arranged perpendicular to a flow direction of a cooling fluid (for example, the flow direction may be along arrow B in FIG. 1C). The cooling ribbons may be arranged such that the cooling fluid can flow through the arcs 122 and over the arcs 122.

The cooling elements 120, e.g. the cooling ribbons, are attached to the die carrier 110 at attachment points 123. According to an example, the cooling elements 123 may comprise or consist of a metal like Al, Cu or Fe. According to an example, the attachment points 123 comprise solder joints, glue or any other suitable bond between the cooling elements 120 and the die carrier 110.

According to an example, consecutive rows 121 may be arranged laterally displaced such that respective attachment points 123 are offset by e.g. one half period (wherein a period is the distance between two consecutive attachment points 123 of a row 121). This example is shown in FIG. 1C.

As shown in FIG. 1A, the rows 121 of cooling elements 120 may be arranged directly under at least one semiconductor die 140 (i.e., directly under the outline of at least one semiconductor die 140). In other words, the rows 121 may be arranged in groups, wherein the rows 121 of each group are arranged directly under at least one semiconductor die 140 in a projection perpendicular to the first and second sides 111, 112 of the die carrier 110.

For example, a first group of rows 124 may be arranged directly under one or more first semiconductor die(s) 141, a second group of rows 125 may be arranged directly under one or more second semiconductor die(s) 142, a third group of rows 126 may be arranged directly under one or more third semiconductor die(s) 143 and a fourth group of rows 127 may be arranged directly under one or more fourth semiconductor die(s) 144 (compare FIGS. 1A and 1C).

Consecutive rows 121 of each group of rows 124-127 may be arranged at a distance to one another of for example 5 mm or less, 4 mm or less, 3 mm or less, 2 mm or less, or 1 mm or less.

A gap 150 may be arranged between consecutive groups of rows 124-127. No cooling elements 120 may be arranged in the gaps 150. Furthermore, no semiconductor dies 140 may be arranged in the gaps 150. In other words, the positions of the cooling elements 120 on the die carrier 110 may correlate with the positions of the semiconductor dies 140. The gaps 150 may have any suitable gap length 1, for example 4 mm or more, 6 mm or more, 8 mm or more, or 10 mm or more. The gap length 1 may for example be about as large as an edge length of the semiconductor dies 140. The gaps 150 may extend across the whole width w of the die carrier 110.

Arranging the cooling elements 120 in correlation with the positions of the semiconductor dies 140 may have the effect of improved heat dissipation in the power semiconductor module. Furthermore, any cooling elements 120 that would be arranged in the gaps 150 would not significantly contribute to heat dissipation (because the die carrier 110 may for example not be configured to distribute heat laterally, away from the outlines of the semiconductor dies 140). Therefore, keeping the gaps 150 (that are free of any semiconductor dies 140) free of cooling elements 120 may help with avoiding an unnecessary pressure drop in the cooling fluid due to unnecessary cooling elements 120. According to an example, the power semiconductor module does not comprise any kind of base plate, wherein the die carrier 110 would be arranged on the base plate and wherein the base plate would be configured to spread heat laterally away from the outlines of the semiconductor dies 140. The die carrier 110 alone may not suffice for laterally spreading the heat, as mentioned above.

According to an example, a first set of rows 121_1 extends essentially over the whole width w of the die carrier 110 and a second set of rows 121_2 extends only partially along the width w. The rows 121 of the second set of rows 121_2 may for example extend over no more than 70%, no more than 60%, no more than 50%, or no more than 40% of the width w. The rows 121 of the second set of rows 121_2 may for example be arranged essentially in the center of the die carrier 110 (i.e. in the middle of the width w, compare FIG. 1C).

At least one row 121 of each group of rows 124-127 may belong to the first set of rows 121_1. At least one row 121 of each group of rows 124-127 may belong to the second set of rows 121_2. For example, each group of rows 124-127 may comprise three rows 121, wherein the middle row 121 may belongs to the second set of rows 121_2 and the outer two rows 121 belong to the first set of rows 121_1. When the semiconductor dies 140 are arranged on the die carrier 110, heat transfer from adjacent semiconductor dies 110 can cause greater warming in semiconductor dies 110 in the center of the die carrier 110. The cooling elements 120 may be arranged predominantly in a center region of the cavity 170 (i.e. in the center region of the die carrier 110), for example at a higher areal density in the center region than in a fringe region, to increase heat transfer in the center.

The fluid channel 100 further comprises the channel wall 130 (not shown in FIG. 1B), the channel wall 130 being arranged opposite the second side 112 of the die carrier 110. The channel wall 130 is configured to form a cavity 170, wherein the cooling elements 120 are arranged in the cavity 170. The width w of the carrier 110 may essentially correspond to the width of the cavity 170. The cavity 170 may comprise an inlet 171 at a first end and an outlet 172 on an opposite second end. Cooling fluid may flow through the cavity 170 from the inlet 171 to the outlet 172. In the fluid channel 100 a "direct liquid cooling" scheme is realized, wherein the second side 112 of the die carrier 110 is in direct contact with the cooling fluid in the cavity 170.

The channel wall 130 may comprise or consist of any suitable material. For example, the channel wall 130 may comprise a metal sheet. The metal sheet may be a structured metal sheet. Structuring may for example comprise stamping and/or cutting. The channel wall 130 may be attached to the die carrier 110 by e.g. gluing, soldering, clamping or any other suitable method.

Figure 2:
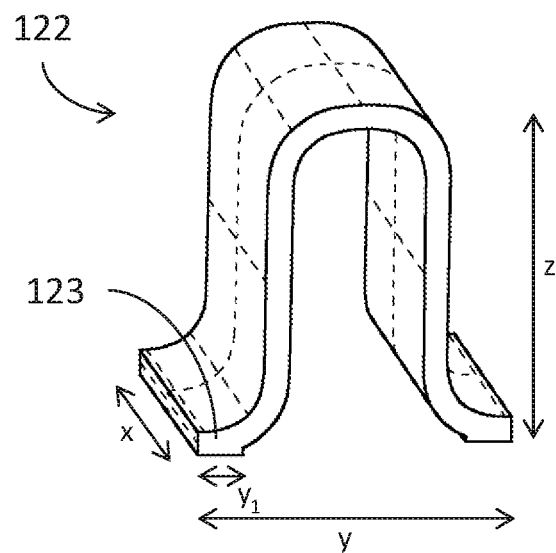
FIG. 2 shows a detailed view of a cooling ribbon according to a specific example.

FIG. 2 shows a detail view of an exemplary arc 122 of a cooling ribbon. The arcs 122 may have a breadth x (breadth of the cooling ribbons) in the range of 0.5 mm to 4 mm, for example about 2 mm. The arcs 122 may have a length y in the range of 1 mm to 4 mm, for example about 2.4 mm. The arcs 122 may have a height z in the range of 1 mm to 6 mm, for example about 2.2 mm or about 2.7 mm. An attachment point 123 may have length y1 in the range of 0.2 mm to 1 mm, for example about 0.35 mm or 0.7 mm.

All arcs 122 may have the same dimensions. However, it is also possible that different arcs 122 have different dimensions. Only one dimension, two dimensions or even all three dimensions may be different among different arcs 122. All arcs 122 of a single row 121 may have the same dimensions and arcs 122 of another row 121 may have one or more different dimensions. According to another example, arcs in a single row 122 may have one or more different dimensions. For example, the arcs 122 in the center of the row 121 may have one or more different dimensions compared to the arcs 122 on the fringes of the row 121. Arcs 122 in the center of a row 121 may e.g. have a smaller height z than arcs 122 on the fringes of the row 121.

Arranging arcs 122 or, more generally, cooling elements 120 with different dimensions in the fluid channel 100 may for example help with adjusting a velocity of a cooling fluid flowing through the fluid channel 100. For example, arranging arcs 122 (i.e. cooling elements 120) with a different height on the fringes compared to the center of the cavity 170 may help with increasing the flow velocity on the fringes compared to the center.

Figure 3:
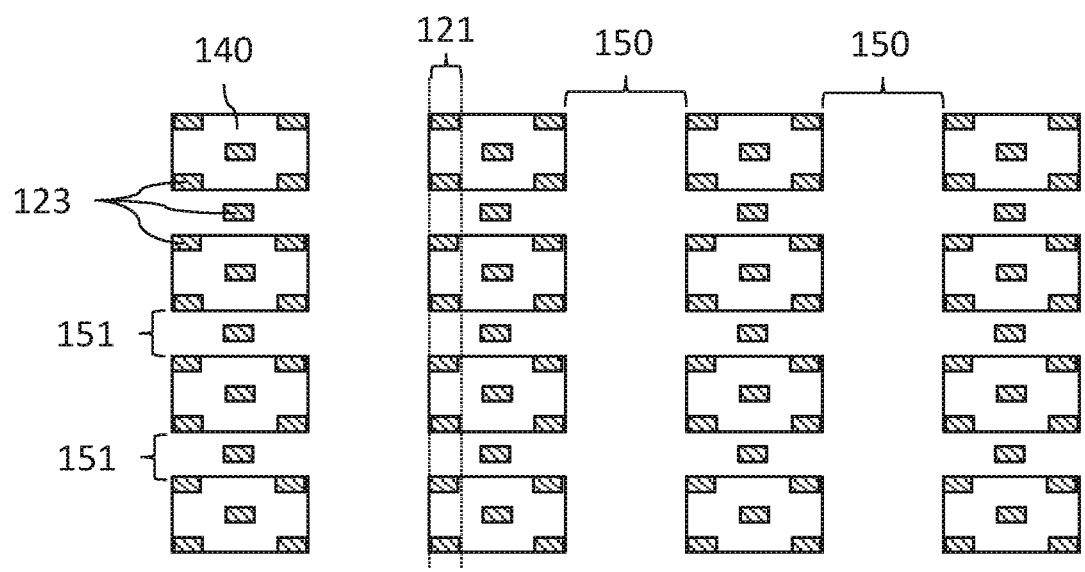
FIG. 3 shows a top-down view of a die carrier that may form part of a fluid channel and/or a power semiconductor module.

FIG. 3 shows a top-down view of the die carrier 110 with the attachment points 123 and positions of the semiconductor dies 140 according to an example. The remaining parts of the fluid channel 100 are omitted for the sake of clarity.

As shown in FIG. 3, a majority of the attachment points 123 may be positioned vertically in alignment with the positions of the semiconductor dies 140. For example, more than 50%, more than 60%, more than 70%, more than 80% or even all of the attachment points 123 may be arranged under the outline of a semiconductor die 140 in a vertical projection.

FIG. 3 shows that the gaps 150 between consecutive rows of semiconductor chips 140 are free of attachment points 123 (that is, free of any cooling elements 120), whereas second gaps 151 arranged along the rows of cooling elements 121 do comprise attachment points 123. However, according to another example, both the gaps 150 and the second gaps 151 are free of attachment points 123. This may for example comprise interrupting the rows 121 in the second gaps 151 or spanning the second gaps 151 with arcs that have an increased length y.

The attachment points 123 may be arranged in an identical pattern under each semiconductor chip 140, as e.g. shown in the example of FIG. 3. However, it is also possible that the attachment points 123 are arranged in different patterns under different semiconductor chips 140.

The attachment points 123 may be arranged in a specific pattern under each semiconductor chip 140, wherein the specific pattern is configured to optimize a heat transfer rate from the semiconductor chips 140 to the cooling elements 120. The attachment points 123 may for example be arranged in the middle of the edges of the semiconductor chips 140. According to another example, the attachment points 123 may be arranged in the corners and/or in the center of the outlines of the semiconductor chips 140, as shown in FIG. 3.

The attachment points 123 may for example have a rectangular outline. The longer side of the rectangular outline may be arranged parallel to an edge of the semiconductor chips 140, e.g. parallel to a longer edge in the case that the semiconductor chips 140 have a rectangular outline themselves.

Figure 4:
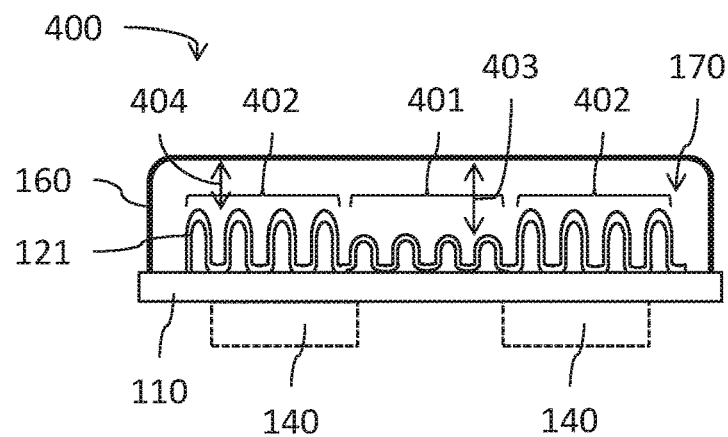
FIG. 4 shows a further fluid channel for a power semiconductor module, wherein the fluid channel comprises cooling elements with different heights.

FIG. 4 shows a further fluid channel 400, which may be similar or identical to the fluid channel 100, except for the differences described in the following. The fluid channel 400 is shown in a side view that corresponds to a view along the arrow B in FIG. 1C.

In fluid channel 400 at least one row 121 comprises cooling elements 120 with different relative heights z. It is also possible that some rows 121 or even all rows 121 comprise cooling elements 120 with different relative heights z.

For example, first cooling elements 401 may have a first height and second cooling elements 402 may have a second height, different from the first height. The first cooling elements 401 may be arranged in the center of the row 121 and the second cooling elements may be arranged on the fringes of the row 121. The first cooling elements 401 may have a first height that is smaller than a second height of the second cooling elements 402. The first height may e.g. be about 70% or less, 50% or less, or 30% or less of the second height.

The channel wall 160 may comprise a main part and side parts, wherein the main part is arranged opposite to the die carrier 110 and the side parts connect the main part and the die carrier 110. The main part may be essentially parallel to the die carrier 110. Due to the different first and second heights of the first and second cooling elements 401, 402, a first headroom 403 above the first cooling elements 401 may be larger than a second headroom 404 above the second cooling elements 402. This may cause a difference in the flow velocity between the center of the cavity 170 (comprising the first cooling elements 401) and the fringes of the cavity 170 (comprising the second cooling elements 402). For example, the flow velocity in the center may be smaller than the flow velocity in the fringes.

Such a difference in the flow velocity between the center of the cavity 170 and the fringes of the cavity 170 may cause a difference in the heat transfer rate between the center and the fringes. For example, a comparatively higher flow velocity may cause a comparatively higher heat transfer rate between the semiconductor dies 140 and the cooling fluid. It is also possible that the different headrooms 403, 404 are used to compensate for a difference in flow velocity and therefore heat transfer rate between the center and the fringes of the cavity 170 that would exist without such measures.

According to an example, the first headroom 403 may be in the range of 0.5 mm to 2 mm, in particular about 1 mm. The second headroom 404 may be in the range of 0.2 mm to 1 mm, in particular about 0.5 mm.

Figure 5:
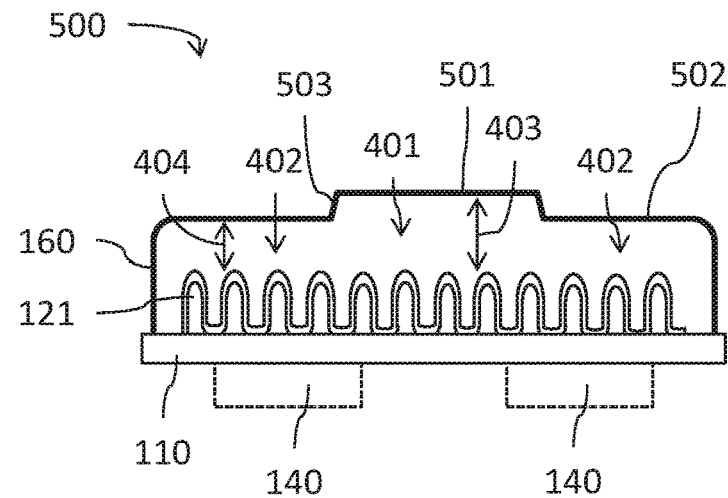
FIG. 5 shows a further fluid channel for a power semiconductor module, wherein the fluid channel comprises a structured channel wall with different channel wall heights.

FIG. 5 shows a further fluid channel 500, which may be similar or identical to the fluid channels 100 and 400, except for the differences described in the following. The fluid channel 500 is shown in a side view that corresponds to a view along the arrow B in FIG. 1C.

In the fluid channel 500 the channel wall 160 comprises a structured profile such that the first headroom 403 above the first cooling elements 401 may be larger than the second headroom 404 above the second cooling elements 402, similar to the fluid channel 400.

For example, a second part 502 of the channel wall 160 above the second cooling elements 402 may have a lower channel wall height compared to a first part 501 of the channel wall 160 above the first cooling elements 401. The channel wall 160 may comprise a sloped part 503 that connects the first part 501 and the second part 502. The sloped part 503 may e.g. have an inclination of about 45° compared to the plane spanned by the die carrier 110.

Arranging the sloped part 503 between the first and second parts 501, 502 instead of a vertical step may help with reducing turbulences in the cooling fluid.

Figure 6:
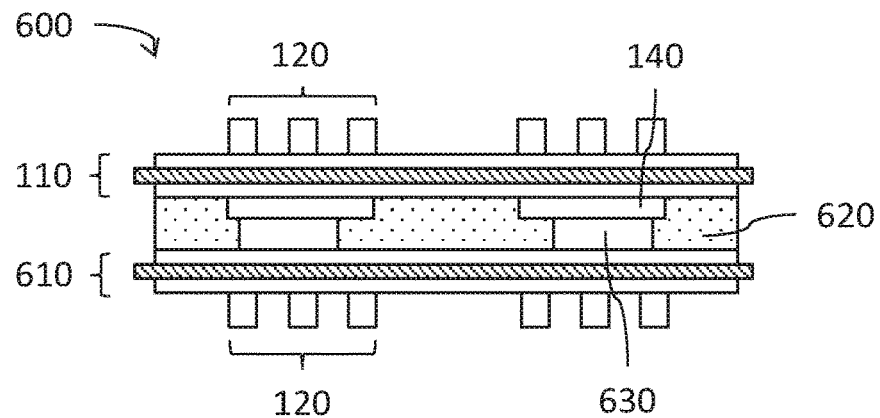
FIG. 6 shows a sectional view of a power semiconductor module according to an example.

FIG. 6 shows a sectional view of a power semiconductor module 600. The fluid channels described above may e.g. be used to cool the power semiconductor module 600.

The power semiconductor module 600 comprises the die carrier 110, the semiconductor dies 140 arranged on the first side 111 of the die carrier 110, and the cooling elements 120 arranged on the second side 112 of the die carrier 110.

The cooling elements 120 may be attached to the die carrier 110 at the attachment points 123 (compare e.g. FIG. 1B) and a majority of the attachment points 123 may be positioned vertically in alignment with the positions of the semiconductor dies 140.

The power semiconductor module 600 may further comprise a second die carrier 610 arranged opposite the die carrier 110, wherein the semiconductor dies 140 are arranged between the die carrier 110 and the second die carrier 610. The power semiconductor module may further comprise an encapsulation 620 encapsulating the semiconductor dies 140. The encapsulation 620 may be arranged at least partially between the die carrier 110 and the second die carrier 610. The semiconductor dies 140 may e.g. be electrically coupled to the second die carrier 610 by conductive spacers 630. For example, first electrodes on a first side of the semiconductor dies 140 may be coupled to the die carrier 110 and second electrodes on a second side of the semiconductor dies 140 may be coupled to the second die carrier 610. As shown in the example of FIG. 6, the die carrier 110 and/or the second die carrier may be of the type DCB, DAB, or AMB.

According to an example, the second die carrier 610 also comprises cooling elements 120 and the power semiconductor module 600 is configured for double sided cooling (in other words, fluid channels may be arranged over both the die carrier 110 and the second die carrier 610). According to another example, the power semiconductor module 600 is not configured for double sided cooling and a fluid channel may consequently only be arranged over one of the die carriers 110, 610.

According to a further example of the power semiconductor module 600, the cooling elements 120 are arranged in rows that are in alignment with the positions of the semiconductor dies 140 (compare FIG. 3). Furthermore, a gap may be arranged between consecutive positions of the semiconductor dies 140 and also a corresponding gap may be arranged between respective consecutive rows of the cooling elements 120.

Figure 7:
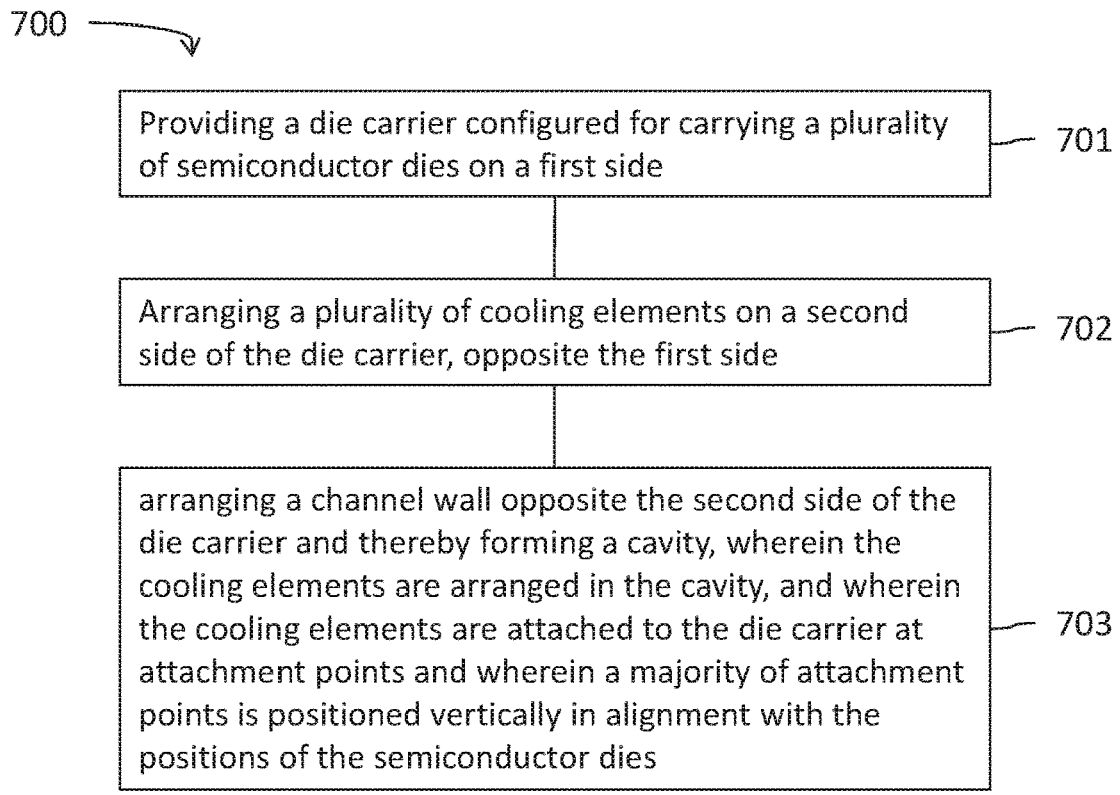
FIG. 7 is a flow chart of a method for fabricating a fluid channel.

FIG. 7 is a flow chart showing a method 700 for fabricating a fluid channel for a power semiconductor module. The method 700 may for example be used to fabricate the fluid channels 100, 400 and 500.

Method 700 comprises at 701 an act of providing a die carrier configured for carrying a plurality of semiconductor dies on a first side, at 702 an act of arranging a plurality of cooling elements on a second side of the die carrier, opposite the first side, and at 703 an act of arranging a channel wall opposite the second side of the die carrier and thereby forming a cavity, wherein the cooling elements are arranged in the cavity, and wherein the cooling elements are attached to the die carrier at attachment points and wherein a majority of attachment points is positioned vertically in alignment with the positions of the semiconductor dies.

According to an example, method 700 may further comprise an act of arranging the cooling elements predominantly in a center region of the cavity.

Figure 8:
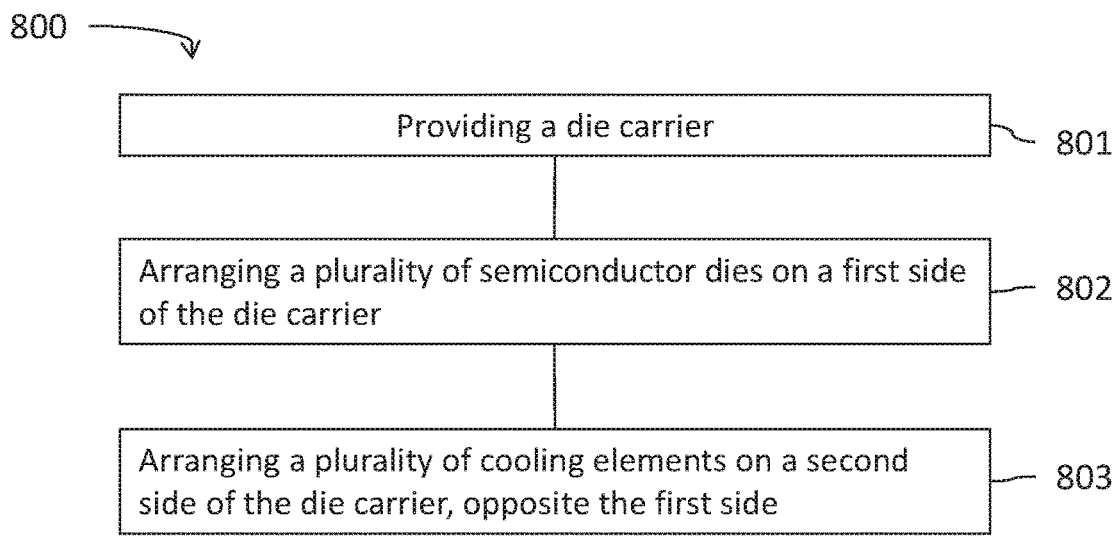
FIG. 8 is a flow chart of a method for fabricating a power semiconductor module.

FIG. 8 is a flow chart showing a method 800 for fabricating a power semiconductor module. The method 800 may e.g. be used to fabricate the power semiconductor module 600.

Method 800 comprises at 801 an act of providing a die carrier, at 802 an act of arranging a plurality of semiconductor dies on a first side of the die carrier, and at 803 an act of arranging a plurality of cooling elements on a second side of the die carrier, opposite the first side.

According to an example of method 800, the cooling elements are attached to the die carrier at attachment points and a majority of attachment points may be positioned vertically in alignment with the positions of the semiconductor dies.

According to another example of method 800, the cooling elements may be arranged in rows that are in alignment with the positions of the semiconductor dies and a gap may be arranged between consecutive positions of the semiconductor dies and also a corresponding gap may be arranged between respective consecutive rows of the cooling elements.

In the following, a fluid channel, a power semiconductor module and a method for fabricating a fluid channel are further described using specific examples.

Example 1 is a fluid channel for a power semiconductor module, the fluid channel comprising: a die carrier configured for carrying a plurality of semiconductor dies on a first side, a plurality of cooling elements arranged on a second side of the die carrier, opposite the first side, and a channel wall arranged opposite the second side of the die carrier and forming a cavity, wherein the cooling elements are arranged in the cavity, wherein the cooling elements are attached to the die carrier at attachment points and wherein a majority of attachment points are positioned vertically in alignment with the positions of the semiconductor dies.

Example 2 is the fluid channel of example 1, wherein the cooling elements are arranged predominantly in a center region of the cavity.

Example 3 is the fluid channel of example 1 or example 2, wherein the attachment points are arranged in a like pattern or a similar pattern or a same pattern or an identical pattern within the outline of each semiconductor die position.

Example 4 is the fluid channel of one of the preceding examples, wherein at least 50% of all attachment points are arranged within the outlines of the semiconductor die positions.

Example 5 is the fluid channel of one of the preceding examples, wherein the cooling elements are arranged in rows perpendicular to the direction of the fluid flow and wherein the attachment points of consecutive rows are offset to the side.

Example 6 is the fluid channel of example 2, wherein the cooling elements are arranged in rows perpendicular to the direction of the fluid flow, wherein a first set of rows extends essentially along the whole width of the cavity, the width being perpendicular to the direction of the fluid flow, and wherein a second set of rows extends only partially along the width.

Example 7 is the fluid channel of one of the preceding examples, wherein the channel wall is structured such that a first height of the cavity is greater than a second height of the cavity, wherein the first height is the height of the center region of the cavity and the second height is the height of a fringe region of the cavity.

Example 8 is the fluid channel of example 7, wherein no more than 50% of the cavity is comprised of the center region and the remaining part of the cavity is comprised of the fringe region.

Example 9 is the fluid channel of example 7 or example 8, wherein the channel wall comprises a gradual transition between the first height and the second height.

Example 10 is the fluid channel of one of examples 7 to 9, wherein the second height is no more than 50% of the first height.

Example 11 is the fluid channel of one of the preceding examples, wherein the cooling elements comprise loops with different loop heights and/or wherein different cooling elements comprise different ribbon widths and/or wherein consecutive attachment points of a cooling ribbon are arranged at different interspaces.

Example 12 is a fluid channel for a power semiconductor module, the fluid channel comprising: a die carrier configured for carrying a plurality of semiconductor dies on a first side, a plurality of cooling elements arranged on a second side of the die carrier, opposite the first side, and a channel wall arranged opposite the second side of the die carrier and forming a cavity, wherein the cooling elements are arranged in the cavity, wherein the cooling elements are arranged more densely in a center region of the cavity than in a fringe region of the cavity, and wherein a height profile of the cavity is configured such that a flow velocity along the fluid channel is greater in the fringe region than in the center region.

Example 13 is the fluid channel of example 12, wherein the cooling elements are arranged in rows and wherein each row is arranged directly under at least one semiconductor die position.

Example 14 is a power semiconductor module, comprising: a die carrier, a plurality of semiconductor dies arranged on a first side of the die carrier, and a plurality of cooling elements arranged on a second side of the die carrier, opposite the first side, wherein the cooling elements are attached to the die carrier at attachment points and wherein a majority of attachment points are positioned vertically in alignment with the positions of the semiconductor dies.

Example 15 is a power semiconductor module, comprising: a die carrier, a plurality of semiconductor dies arranged on a first side of the die carrier, and a plurality of cooling elements arranged on a second side of the die carrier, opposite the first side, wherein the cooling elements are arranged in rows that are in alignment with the positions of the semiconductor dies, and wherein there is a gap between consecutive positions of the semiconductor dies and also a corresponding gap between respective consecutive rows of the cooling elements.

Example 16 is a method for fabricating a fluid channel for a power semiconductor module, the method comprising: providing a die carrier configured for carrying a plurality of semiconductor dies on a first side, arranging a plurality of cooling elements on a second side of the die carrier, opposite the first side, and arranging a channel wall opposite the second side of the die carrier and thereby forming a cavity, wherein the cooling elements are arranged in the cavity, wherein the cooling elements are attached to the die carrier at attachment points and wherein a majority of attachment points is positioned vertically in alignment with the positions of the semiconductor dies.

Example 17 is the method of example 16, further comprising: arranging the cooling elements predominantly in a center region of the cavity.

Example 18 is an apparatus comprising means for performing the method according to example 16 or 17.

While the disclosure has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure.

What is claimed is:

1. A fluid channel for a power semiconductor module, the fluid channel comprising:
    a die carrier configured to carry a plurality of semiconductor dies on a first side;
    a plurality of cooling elements arranged on a second side of the die carrier opposite the first side; and
    a channel wall arranged opposite the second side of the die carrier and forming a cavity,
    wherein the cooling elements are arranged in the cavity,
    wherein the cooling elements are attached to the die carrier at attachment points,
    wherein a majority of the attachment points are positioned vertically in alignment with the positions of the semiconductor dies,
    wherein the cooling elements are non-uniformly spaced.

2. The fluid channel of claim 1, wherein the cooling elements are arranged predominantly in a center region of the cavity.

3. The fluid channel of claim 1, wherein the attachment points are arranged in a like pattern within an outline of each semiconductor die position.

4. The fluid channel of claim 1, wherein at least 50% of all of the attachment points are arranged within outlines of the semiconductor die positions.

5. The fluid channel of claim 1, wherein the cooling elements are arranged in rows perpendicular to a direction of fluid flow, and wherein the attachment points of consecutive rows are offset to the side.

6. The fluid channel of claim 1, wherein the cooling elements are arranged in rows perpendicular to a direction of fluid flow, wherein a first set of the rows extends along the whole width of the cavity, the width being perpendicular to the direction of the fluid flow, and wherein a second set of the rows extends only partially along the width.

7. The fluid channel of claim 1, wherein the channel wall is structured such that a first height of the cavity is greater than a second height of the cavity, wherein the first height is the height of a center region of the cavity and the second height is the height of a fringe region of the cavity.

8. The fluid channel of claim 7, wherein no more than 50% of the cavity is comprised of the center region and the remaining part of the cavity is comprised of the fringe region.

9. The fluid channel of claim 7, wherein the channel wall comprises a gradual transition between the first height and the second height.

10. The fluid channel of claim 7, wherein the second height is no more than 50% of the first height.

11. The fluid channel of claim 1, wherein the cooling elements comprise loops with different loop heights.

12. The fluid channel of claim 1, wherein different ones of the cooling elements comprise different ribbon widths.

13. The fluid channel of claim 1, wherein consecutive ones of the attachment points of a cooling ribbon are offset by one half period.

14. The fluid channel of claim 1, wherein the die carrier includes at least one electrically conductive layer arranged over an electrically insulating layer.

15. A fluid channel for a power semiconductor module, the fluid channel comprising:
    a die carrier configured to carry a plurality of semiconductor dies on a first side;
    a plurality of cooling elements arranged on a second side of the die carrier opposite the first side; and
    a channel wall arranged opposite the second side of the die carrier and forming a cavity,
    wherein the cooling elements are arranged in the cavity,
    wherein the cooling elements are arranged more densely in a center region of the cavity than in a fringe region of the cavity,
    wherein a height profile of the cavity is configured such that a flow velocity along the fluid channel is greater in the fringe region than in the center region.

16. The fluid channel of claim 15, wherein the cooling elements are arranged in rows, and wherein each row is arranged directly under at least one semiconductor die position.

17. A power semiconductor module, comprising:
    a die carrier;
    a plurality of semiconductor dies arranged on a first side of the die carrier; and
    a plurality of cooling elements arranged on a second side of the die carrier opposite the first side,
    wherein the cooling elements are attached to the die carrier at attachment points,
    wherein a majority of the attachment points are positioned vertically in alignment with positions of the semiconductor dies,
    wherein the cooling elements are non-uniformly spaced.

18. A power semiconductor module, comprising:
    a die carrier;
    a plurality of semiconductor dies arranged on a first side of the die carrier; and
    a plurality of cooling elements arranged on a second side of the die carrier opposite the first side,
    wherein the cooling elements are arranged in rows that are in alignment with positions of the semiconductor dies,
    wherein there is a gap between consecutive positions of the semiconductor dies and also a corresponding gap between respective consecutive rows of the cooling elements,
    wherein the cooling elements are non-uniformly spaced.

19. A method for fabricating a fluid channel for a power semiconductor module, the method comprising:
    providing a die carrier configured to carry a plurality of semiconductor dies on a first side;
    arranging a plurality of cooling elements on a second side of the die carrier opposite the first side; and
    arranging a channel wall opposite the second side of the die carrier and thereby forming a cavity,
    wherein the cooling elements are arranged in the cavity,
    wherein the cooling elements are attached to the die carrier at attachment points, wherein a majority of the attachment points is positioned vertically in alignment with positions of the semiconductor dies,
wherein the cooling elements are non-uniformly spaced.

20. The method of claim 19, further comprising:
arranging the cooling elements predominantly in a center region of the cavity.

\* \* \* \* \*